(12) United States Patent
Nakagawa (10) Patent No.: US 10,031,388 B2
(45) Date of Patent: Jul. 24, 2018

(54) CIRCUIT BOARD AND DISPLAY APPARATUS

(71) Applicant: Sakai Display Products Corporation, Sakai-shi, Osaka (JP)

(72) Inventor: Hidetoshi Nakagawa, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 90 days.

(21) Appl. No.: 15/036,346

(22) PCT Filed: Nov. 14, 2013

(86) PCT No.: PCT/JP2013/080772
§ 371 (c)(1),
(2) Date: May 12, 2016

(87) PCT Pub. No.: WO2015/071989
PCT Pub. Date: May 21, 2015

(65) Prior Publication Data
US 2016/0282688 A1 Sep. 29, 2016

(51) Int. Cl.
*G02F 1/1362* (2006.01)
*H05K 1/02* (2006.01)
*H05K 3/22* (2006.01)

(52) U.S. Cl.
CPC ..... *G02F 1/136259* (2013.01); *H05K 1/0266* (2013.01); *H05K 1/0269* (2013.01); *H05K 1/0296* (2013.01); *G02F 2001/136263* (2013.01); *H05K 3/22* (2013.01); *H05K 2201/09009* (2013.01)

(58) Field of Classification Search
CPC ... G02F 1/136259; G02F 2001/136263; G02F 2001/136272; H05K 1/0266; H05K 1/0269; H05K 1/0296
See application file for complete search history.

(56) References Cited

U.S. PATENT DOCUMENTS

| | | | |
|---|---|---|---|
| 6,639,634 B1 | 10/2003 | Zhang et al. | |
| 8,629,948 B2 * | 1/2014 | Hara | G02F 1/136213 349/192 |
| 2005/0116915 A1 | 6/2005 | Nakajima et al. | |
| 2013/0235292 A1 | 9/2013 | Hara et al. | |

FOREIGN PATENT DOCUMENTS

| | | |
|---|---|---|
| JP | H10-319438 A | 12/1998 |
| JP | 2000-215669 A | 10/2000 |
| JP | 2001-261581 A | 9/2001 |

(Continued)

*Primary Examiner* — Timothy Thompson
*Assistant Examiner* — Amol Patel
(74) *Attorney, Agent, or Firm* — Rudy J. Ng; Bret E. Field; Bozicevic, Field & Francis LLP (57) ABSTRACT

Provided are a circuit board and a display apparatus in which, when a worker restores a cut wiring with laser, the worker may easily determine a portion to be irradiated with laser by the naked eye.
In a circuit board including multiple layered wiring parts (G, O) and an insulating part deposited between layers of the wiring parts (G, O), the insulating portion has a missing part (F) at a superposed position where the wiring parts are superposed onto each other in a layered direction, and a marker (P) indicating the presence of the missing part (F) is formed.

6 Claims, 11 Drawing Sheets

(56) References Cited

FOREIGN PATENT DOCUMENTS

| | | |
|---|---|---|
| JP | 2004-070182 A | 3/2004 |
| JP | 2005-091391 A | 4/2005 |
| JP | 2010-145667 A | 7/2010 |
| JP | 2010-145772 A | 7/2010 |
| WO | WO2012105180 A1 | 8/2012 |

* cited by examiner

CIRCUIT BOARD AND DISPLAY APPARATUS

This application is the national phase under 35 U.S.C. § 371 of PCT International Application No. PCT/JP2013/080772 which has an International filing date of Nov. 14, 2013 and designated the United States of America.

BACKGROUND

Technical Field

The present invention relates to a circuit board including multiple layered wiring parts and an insulating part deposited between the layers of the wiring parts, and to a display apparatus comprising the circuit board.

Description of Related Art

In recent years, electric devices have been miniaturized and thinned, while the number of crossings among wirings on built-in boards has been increased for such miniaturization and thinning.

This has resulted in such a problem that, if a wiring is cut during the procedure of manufacturing an electric device, it is difficult to restore the cut wiring.

To address this problem, Japanese Patent Laid-Open Application No. H10-319438 discloses an active matrix substrate in which a dummy wiring of a conductive film is provided in advance in a form of completely being covered under a source wiring except for the crossing part of a gate wiring and the source wiring, and if a portion of the source wiring is cut, the cut portion of the source wiring may easily be restored by electrically connecting the dummy wiring and the source wiring by irradiating, with laser, the portion where the dummy wiring and the source wiring remaining without being cut are over lapped.

SUMMARY

Meanwhile, if wirings cross each other on a circuit board, a problem may arise in that a so-called wiring cross capacitance is increased.

Therefore, in general, in order to address such a problem, multiple insulating layers are provided between wirings.

Furthermore, in such a case that multiple insulating layers are present between wirings, it is necessary to change the condition of laser irradiation for each insulating layer in restoring a cut part with laser as described above, which deteriorates the workability. It is therefore required to form at least the portion to be irradiated with laser as a single insulating layer.

A worker, however, tries to find the portion to be irradiated with laser on the circuit board while looking at a circuit design drawing since it is difficult to find such a portion by the naked eye, which lowers workability in addition to difficulty in determination of a correct position. Moreover, the active matrix substrate according to Japanese Patent Laid-Open Application No. H10-319438 cannot solve such problems.

The present invention has been made in view of the circumstances described above, and aims to provide a circuit board including multiple layers of wiring parts formed by lamination of layers and an insulating part deposited between the layers, in which the insulating part has a missing part at a superposed position where wiring parts are superposed onto one another in the layered direction and a marker indicating the presence of the missing part is formed so as to allow a worker to easily determine a portion to be irradiated with laser by the naked eye in restoring a cut portion of a wiring with laser, and to provide a display apparatus.

In a circuit board according to one embodiment of the present invention, including a plurality of layered wiring parts and an insulating part deposited between layers of the plurality of wiring parts, the insulating portion has a missing part at a superposed position where wiring parts are superposed onto one another in a layered direction, and a marker indicating the presence of the missing part is formed.

According to the embodiment of the present invention, in restoring a cut part of a wiring with laser, the missing part is formed at a position corresponding to the superposed position in the insulating part and a marker indicating the presence of the missing part is formed at the superposed position in order to facilitate the restoring.

In the circuit board according to the embodiment of the present invention, it is preferable that the insulating part is formed of two layers with different physical properties, any one of the layers being missing at the superposed position, and the marker is formed at the superposed position of the wiring part and is a convex part or a concave part formed in a direction along the layers.

According to the preferable embodiment of the present invention, in the case where the insulating part is formed of two layers with different physical properties, any one of the two layers is missing at a position corresponding to the superposed position so as to facilitate restoring of a cut wiring with laser. Moreover, a convex part or concave part is formed as the marker in a direction along the layers at a portion of the wiring part corresponding to the superposed position.

In the circuit board according to the embodiment of the present invention, it is preferable that the insulating part has a recess formed at the superposed position, and the marker is formed at the superposed position of the wiring part and is a convex part or a concave part formed in a direction along the layers.

According to the preferable embodiment of the present invention, in the case where the insulating part is formed of a single layer, a recess is formed at a position corresponding to the superposed position so as to facilitate restoring of a cut wiring with laser. Moreover, a convex part or concave part is formed as the marker in a direction along the layers at a portion of the wiring part corresponding to the superposed position.

In the circuit board according to the embodiment of the present invention, it is preferable that the convex part or the concave part has a shape conforming to a missing area concerning the missing part.

According to the preferable embodiment of the present invention, the convex part or concave part has a shape conforming to the missing area concerning the missing part, to allow a worker to easily presume the missing area concerning the missing part in restoring the cut wiring.

In the circuit board according to the embodiment of the present invention, it is preferable that the convex part or the concave part is formed at a position conforming to a middle part of a missing area concerning the missing part.

According to the preferable embodiment of the present invention, the convex part or concave part is formed at a position conforming to a middle part of the missing area concerning the missing part, to allow a worker to easily presume the missing area concerning the missing part in restoring the cut wiring.

In the circuit board according to the embodiment of the present invention, it is preferable that multiple convex parts or concave parts are formed at positions conforming to both ends of a missing area concerning the missing part.

According to the preferable embodiment of the present invention, the convex parts or concave parts are formed at positions conforming to both ends of the missing area concerning the missing part, to allow a worker to easily presume the missing area concerning the missing part in restoring the cut wiring.

A display apparatus according to one embodiment of the present invention includes the circuit board according to any one of the aspects described above, and a display unit on which an image is displayed based on a signal input through the wiring part of the circuit board.

According to the embodiment of the present invention, an image is displayed at the display unit based on a signal input through the wiring part of the circuit board.

According to the embodiment of the present invention, as described above, when a worker restores a cut wiring with layer, the worker may easily determine, by the naked eye, a portion to be irradiated with layer.

The above and further objects and features will move fully be apparent from the following detailed description with accompanying drawings.

DETAILED DESCRIPTION

Embodiments of the present invention will be described below with reference to the drawings. Though, in the description below, a circuit board incorporated in a liquid crystal display panel is described as a circuit board, the circuit board according to the present invention is not limited to the one in a liquid crystal panel. For example, the circuit board according to the present invention may also be applied to an image shift panel in which pixels are optically shifted in sequence, or a parallax barrier panel capable of displaying a three-dimensional image. Moreover, the circuit board according to the present invention may also be applied to an inorganic or organic electroluminescent panel, a plasma display panel, an electrochromic display panel, an electrophoretic display panel and the like. Furthermore, it is understood that the circuit board according to the present invention may be also applied to other electric devices, not limited to the display apparatuses as described above.

Embodiment 1

Figure 1:
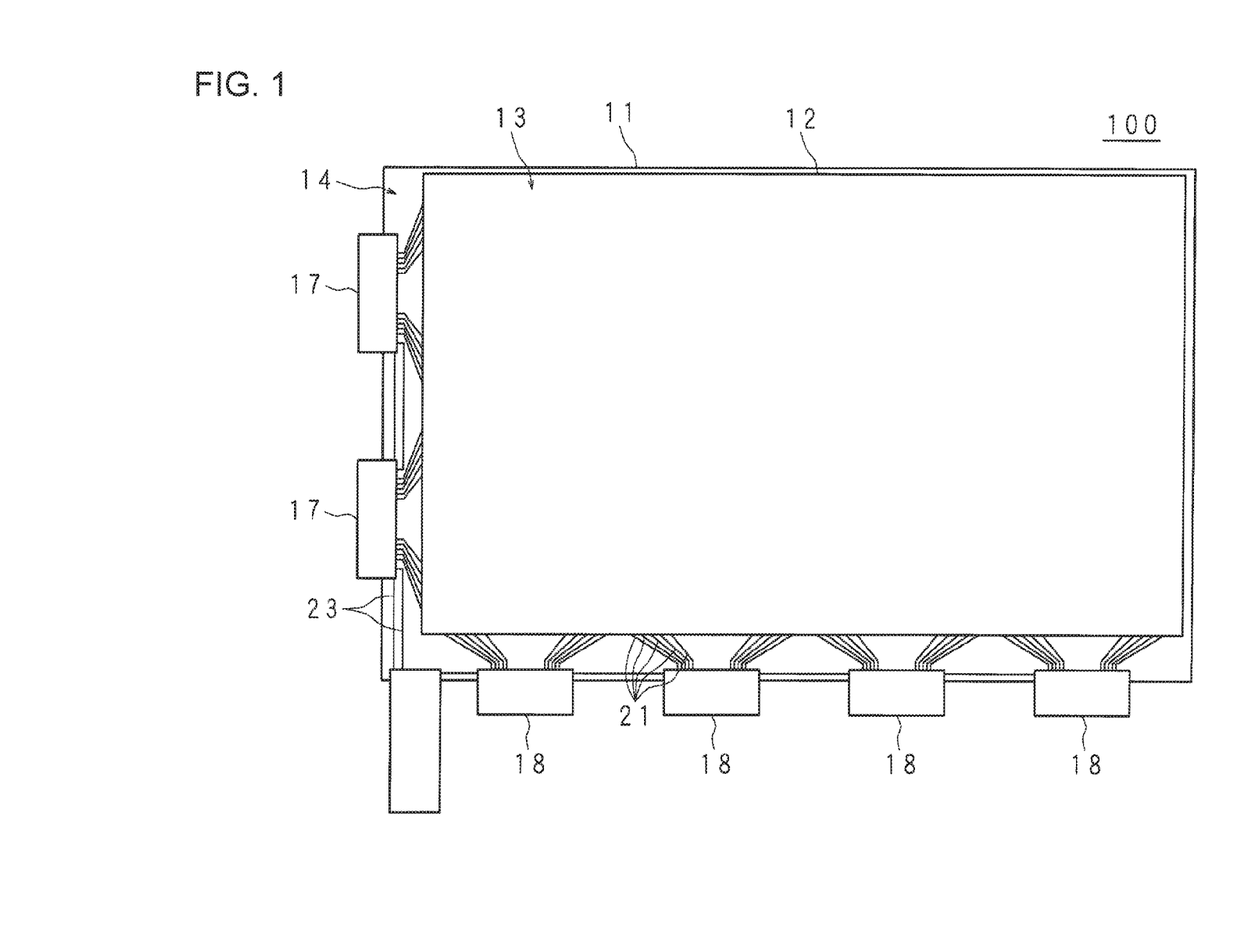
FIG. 1 is a schematic configuration view illustrating main components of an internal configuration of a liquid crystal display panel according to Embodiment 1 of the present invention.

FIG. 1 is a schematic configuration view illustrating main components of an internal configuration of a liquid crystal display panel according to Embodiment 1 of the present invention. A liquid crystal display panel 100 according to Embodiment 1 of the present invention is a liquid crystal display panel of a so-called active matrix type, which employs a thin film transistor (TFT). The liquid crystal display panel 100 has a structure in which a TFT substrate 11 and a color filter (CF) substrate 12 opposed to the TFT substrate 11 are bonded to each other, an opposing surface of the TFT substrate 11 partly being exposed. The liquid crystal display panel 100 has a liquid crystal layer between the TFT substrate 11 and the CF substrate 12.

The inner part of the CF substrate 12 in FIG. 1 is a display region 13 in which an image is displayed based on an image signal. A region peripheral to the display region 13 is also referred to as a frame region 14.

The TFT substrate 11 includes, on a glass substrate, a scanning wiring for a scanning signal and a signal wiring for a data signal formed to cross each other, a TFT element provided for each pixel, and a pixel electrode. A common electrode is formed on a surface at the TFT substrate 11 side of the CF substrate 12. In the frame region 14 of the TFT substrate 11, multiple gate drivers 17 controlling sequential scanning of scanning wirings and multiple source drivers 18 supplying image data signals to signal wirings.

In the liquid crystal display panel 100, each of the gate drivers 17 and the source drivers 18 includes, for example, an IC drive wiring to which signals are input from the outside, an opposing electrode wiring, a signal output wiring for supplying image signals from the gate driver 17 or the source driver 18 to the display region, and a relay wiring for inputting/outputting drive signals to the drivers.

A wiring part consisting of multiple wirings is formed in the frame region 14. Examples of such wirings include a wiring 21 for outputting image data signals to the display region 13 (electric wiring for introduction to the display region), and a power-supply wiring 23 electrically connecting adjacent gate drivers 17 or adjacent source drivers 18 and electrically connecting the gate driver 17 and the source driver 18.

The wiring in the display region 13 corresponds to a single layer film or a layered film containing one, two or more types of conductive materials, and is formed by a film thinning process in which a TFT is formed. In general, the wiring part in the display region 13 is a layered film of a metal thin film and a conductive oxide film. Wirings 21 and 23 in the frame region 14 are formed by the same process and with the same material as used for forming wirings in the display region 13.

On the other hand, in a display apparatus such as the liquid crystal display panel 100, the number of crossings between these wirings (for scanning signals, for data signals and the like, for example) is increased in order to realize the display of a highly precise image while further reducing the size and thickness of the apparatus, thereby increasing a so-called wiring cross capacitance. In general, only one insulating layer (hereinafter referred to as a GI insulating layer) is formed between the gate wiring concerning the gate driver 17 and the source wiring concerning the source driver 18. The GI insulating layer alone, however, cannot sufficiently cope with the problem of such increase in the wiring cross capacitance.

In order to address this, the liquid crystal display panel 100 according to Embodiment 1 includes, in addition to the GI insulating layer, a Spin on Glass (SOG) insulating layer made of an SOG material formed between the gate wiring and the source wiring. An example of the SOG material includes silica. This can widen the distance between the gate wiring and the source wiring while reducing the wiring cross capacitance. Such a method is a known technique and therefore will not be described in detail.

Meanwhile, in the process of manufacturing the liquid crystal display panel 100, if a wiring in the frame region 14 is cut, for example, no signal can be input to the display region 13, resulting in a defective device which cannot display a correct image.

To deal with such a possibility, a so-called redundant wiring is arranged in parallel with one wiring. The redundant wiring circuit is, so to speak, a detour circuit where, for example, the redundant wiring is a source wiring if the one wiring is a gate wiring whereas the redundant wiring is a gate wiring if the one wiring is a source wiring.

Figure 2:
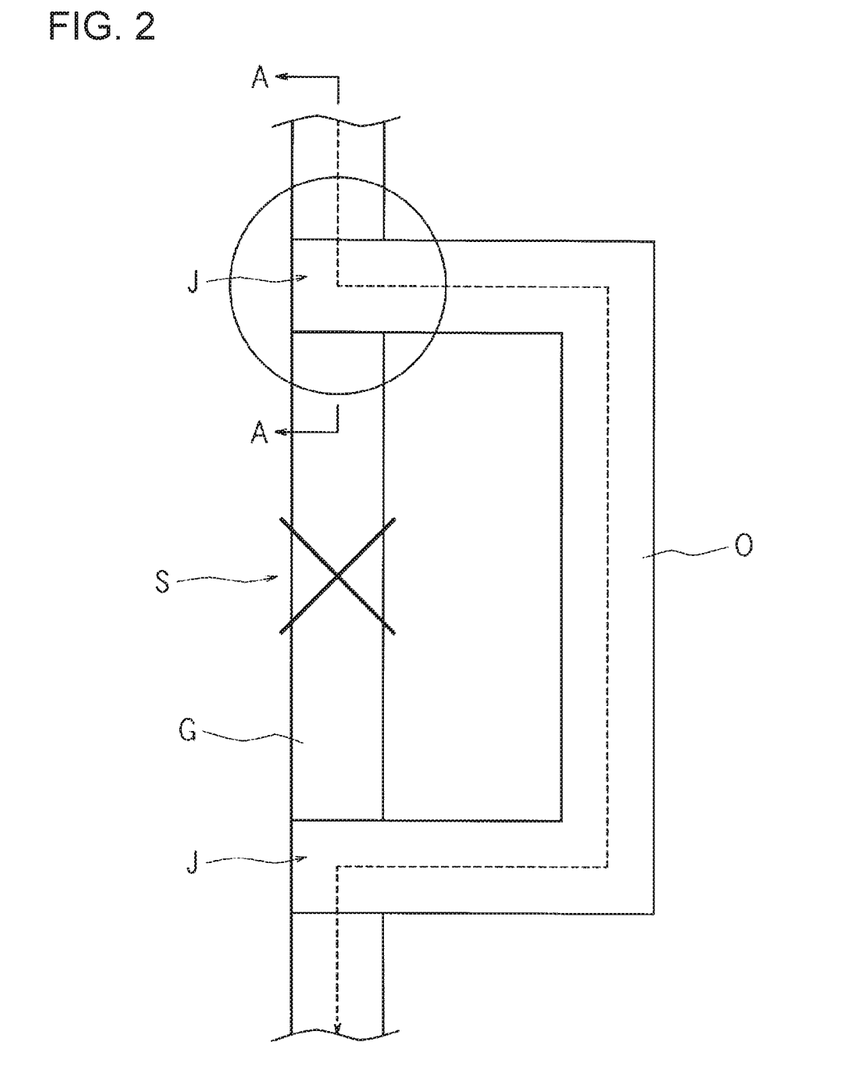
FIG. 2 is an explanatory view illustrating a measure for a cut wiring in a frame region of the liquid crystal display panel according to Embodiment 1 of the present invention.

FIG. 2 is an explanatory view illustrating a measure for a cut wiring in the frame region 14 of the liquid crystal display panel 100 according to Embodiment 1 of the present invention. For the sake of convenience, the wirings in the frame region 14 of the liquid crystal display panel 100 is described as an example, in which a source wiring O is arranged as a redundant wiring for a gate wiring G.

In FIG. 2, a point S is a portion where the wiring is cut, and a point J is a position where the source wiring O and the gate wiring G are superposed onto each other in the layering method. In other words, the GI insulating layer and the SOG insulating film are interposed at the point J between the gate wiring G and the source wiring O.

In the vicinity of the point J, the end of the source wiring O is superposed onto the gate wiring G while forming a "T" shape with the gate wiring G in the layered direction.

If, for example, the gate wiring G is cut at the point S in the manufacturing process, no signal can be input to the display region 13, resulting in an incorrect display of an image. Here, if the gate wiring G is connected to the source wiring O at both points J, a signal is detoured and propagated along the direction of arrow in the drawing, which can solve the problem. Such a solution is known and therefore will not be described in detail.

Figure 3:
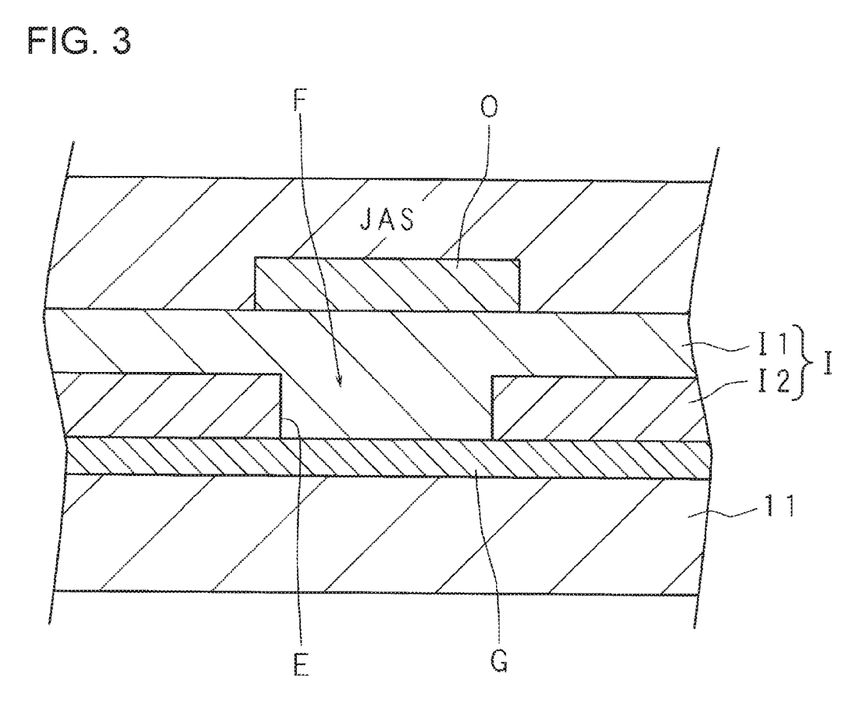
FIG. 3 is a section view taken along a line A-A at a point J in FIG. 2.

FIG. 3 is a section view taken along the line A-A at a point J in FIG. 2. The gate wiring G is layered on the surface of the TFT substrate 11 at the CF substrate 12 side, and the source wiring O is further layered over the gate wiring G, as described above, with an insulating part I formed of a GI insulating layer I1 and an SOG insulating film I2 interposed in between. Moreover, at the CF substrate 12 side of the source wiring O, an organic interlayer insulating film (JAS) is formed.

Furthermore, the insulating part I has a missing part F. The missing part F is formed at the point J where the gate wiring G and the source wiring O are superposed onto each other in the layered direction of these wirings.

More specifically, the SOG insulating film I2 is missing and absent at the point J. That is, at the point J, a removed part E is present in which the SOG insulating film I2 is not formed but the GI insulating film I1 is formed instead. Accordingly, if the point S of the gate wiring G in FIG. 2 is cut, as described above, the gate wiring G and the source wiring O may be connected with each other at both of the points J.

In other words, the points J in FIG. 2 are both irradiated with laser of a specific frequency along the layered direction, which melts the source wiring O and the insulating part I so as to connect the gate wiring G and the source wiring O with each other. Hereinafter, this technique is referred to as a laser melting method.

However, if the laser melting method is carried out as described above, in the case where the insulating part to be a target irradiated with laser is formed of multiple insulating layers with different physical properties, it is necessary to change the condition of laser irradiation for each of the insulating layers, deteriorating the workability.

Accordingly, in the case where the insulating part of the portion used in the laser melting method, i.e. the portion to be a target irradiated with laser, is formed of multiple types of insulating layers as indicated by the insulating part I, the SOG insulating film I2 is provided with a missing part such as the removed part E in advance, so that the workability in the laser melting method may be improved because only one type of insulating layer is formed as far as the portion is concerned.

In general, when the laser melting method is carried out by a worker, the worker performs such work while looking at a circuit design drawing in order to determine a portion where the SOG insulating film I2 is missing and the source wiring O is superposed onto the gate wiring G. In such a case, however, it is difficult to determine a correct portion and also the workability is lowered.

To address this, in the liquid crystal display panel 100 according to Embodiment 1 of the present invention, a marker indicating the presence of the missing part F is formed, which can solve the problem. The marker indicating the presence of the missing part F in the liquid crystal display panel 100 according to Embodiment 1 of the present invention will be described below in detail.

Figure 4:
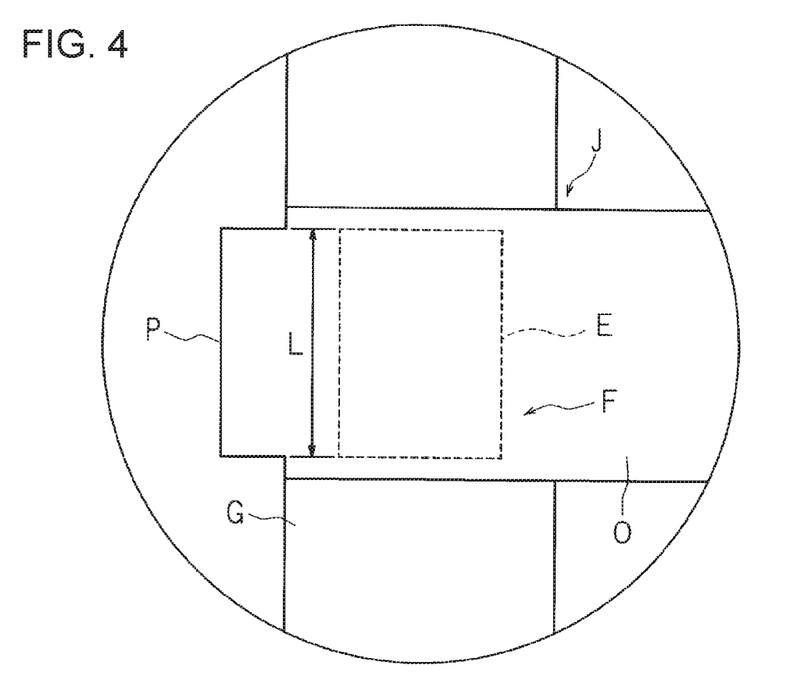
FIG. 4 is an enlarged view illustrating a circled part in FIG. 2 with an enlarged scale.

FIG. 4 is an enlarged view illustrating a circled part in FIG. 2 with an enlarged scale. The portion enclosed by a dotted line represents a portion where the SOG insulating film I2 is missing, i.e. an area concerning the removed part E.

In the source wiring O, a convex part P is formed as a marker indicating the presence of the missing part F at the position of the point J superposed onto the gate wiring G. The convex part P is formed to protrude from the end of the source wiring O in the direction along the layers. Moreover, the convex part P is formed in the layered direction so as not to be overlapped with the gate wiring G. The convex part P has a rectangular shape, the protruding direction being the short-side direction.

Furthermore, the convex part P has a shape conforming to the missing area concerning the missing part F. In other words, the convex part P has a shape conforming to an area concerning the removed part E of the missing part F. More specifically, the dimension of the convex part P in the long-side direction, i.e. a dimension L of the convex part P in the direction along the gate wiring G, corresponds to the area (dimension) of the removed part E in the same direction. It is to be noted that the convex part P is formed as a part of the source wiring O (or the gate wiring G) together with these wirings when the wirings are formed in layers.

Thus, in the liquid crystal display panel 100 according to Embodiment 1, when the laser melting method is carried out by a worker, the worker can easily determine a portion where the SOG insulating film I2 is missing and the source wiring O is superposed onto the gate wiring G. Moreover, it is possible to presume an area where the SOG insulating film I2 is missing, i.e. an area concerning the removed part E, based on the shape of the convex part P.

As described above, the convex part P is made of the same material as that of the source wiring O (or gate wiring G), meaning that it has a light blocking property. Therefore, when a worker carries out the laser melting method in practice, the TFT substrate 11 is irradiated with light from its back surface, which allows the worker to easily determine the portion where the SOG insulating film I2 is missing and the source wiring O is superposed onto the gate wiring G based on the shadow of the light-blocking source wiring O (or the gate wiring G), i.e. the shadow of the convex part P.

Embodiment 2

Figure 5:
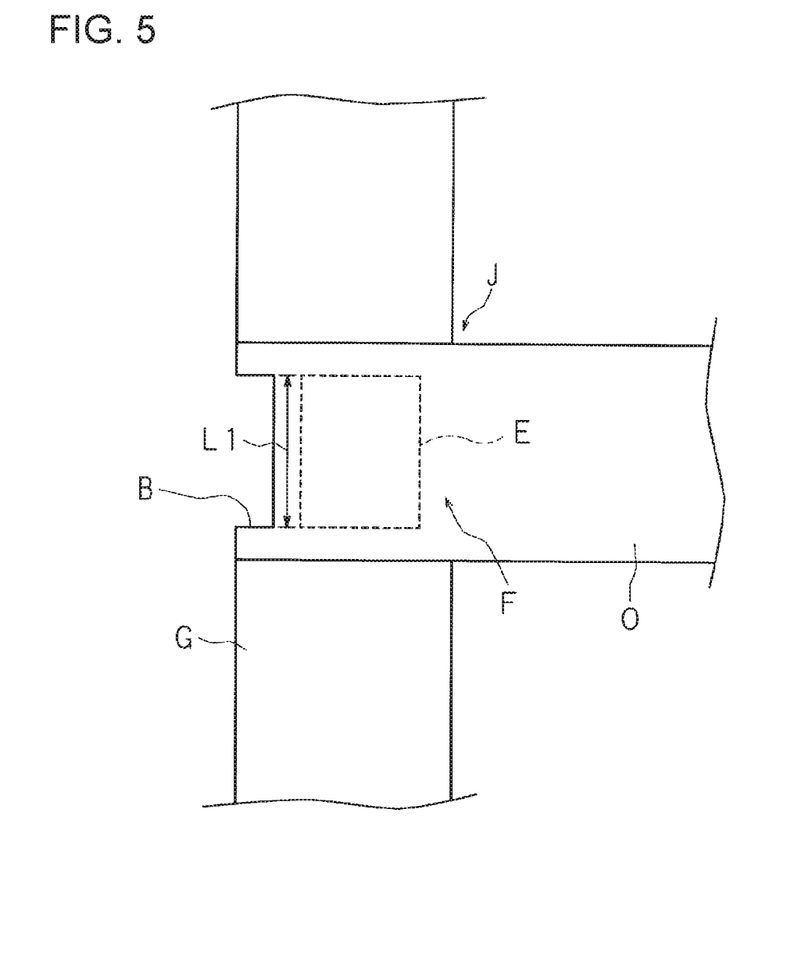
FIG. 5 is an explanatory view illustrating a shape of a concave part in the liquid crystal display panel according to Embodiment 2 of the present invention.

In Embodiment 2, a concave part B is formed as a marker indicating the presence of the missing part F instead of the convex part P. This will be described below in detail.

FIG. 5 is an explanatory view illustrating the shape of the concave part B in the liquid crystal display panel 100 according to Embodiment 2 of the present invention. The portion enclosed by a dotted line represents a portion where the SOG insulating film I2 is missing, i.e. an area concerning the removed part E.

As in the convex part P in Embodiment 1, the concave part B is formed at the position of the point J in the source wiring O where the gate wiring G and the source wiring O are superposed onto each other, and is formed from the end of the source wiring O in a direction along the source wiring O. For example, the concave part B has a rectangular shape, the direction along the source wiring O being the short-side direction.

Moreover, the concave part B has a shape conforming to the missing area concerning the missing part F, a dimension L1 in the long-side direction of the concave part B corresponding to the area (dimension) of the removed part E in the same direction. It is to be noted that the concave part B is formed as a part of the source wiring O (or the gate wiring G) together with these wirings when the wirings are formed in layers.

Thus, in the liquid crystal display panel 100 according to Embodiment 2, when the laser melting method is carried out by a worker, the worker can easily determine a portion where the SOG insulating film I2 is missing and the source wiring O is superposed onto the gate wiring G. Moreover, it is possible to presume an area where the SOG insulating film I2 is missing, i.e. an area concerning the removed part E, based on the shape of the concave part B.

As described above, the concave part B is made of the same material as that of the source wiring O (or the gate wiring G), and thus has a light blocking property. Therefore, when a worker carries out the laser melting method in practice, the TFT substrate 11 is irradiated with light from its back surface, which allows the worker to easily determine the portion where the SOG insulating film I2 is missing and the source wiring O is superposed onto the gate wiring G based on the shadow of the concave part B.

Portions similar to those in Embodiment 1 are denoted by the same reference codes and will not be described in detail.

Embodiment 3

Figure 6:
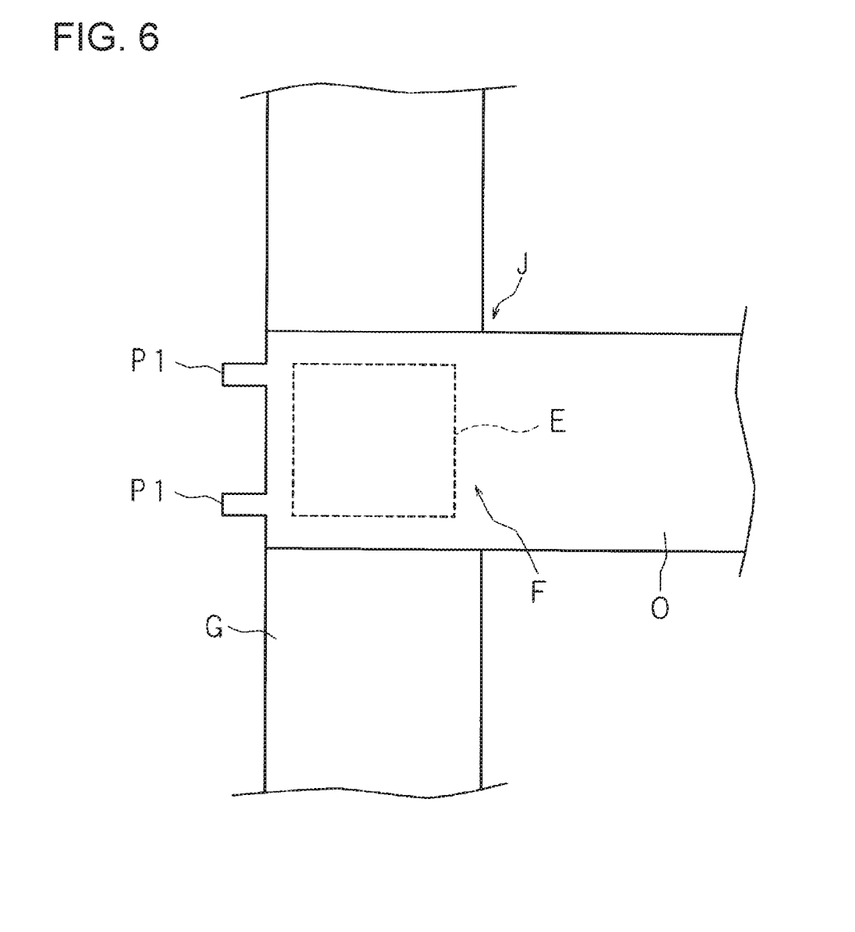
FIG. 6 is an explanatory view illustrating a shape of a convex part in the liquid crystal display panel according to Embodiment 3 of the present invention.

In Embodiment 3, a convex part P1 consisting of two protruding parts is formed instead of the convex part P. This will be described below in detail.

FIG. 6 is an explanatory view illustrating a shape of the convex part P1 in the liquid crystal display panel 100 according to Embodiment 3 of the present invention. The portion enclosed by the dotted line represents an area concerning the removed part E.

The convex part P1 consists of two protruding parts formed at the position of the point J in the source wiring O where the source wiring O is superposed onto the gate wiring G, and is formed from the end of the source wiring O so as to protrude in a direction along the layers. For example, each protruding part of the convex part P1 has a rectangular shape, the protruding direction being the long-side direction.

Furthermore, the convex part P1 is formed at a position conforming to both ends of the missing area concerning the missing part F. That is, the convex part P1 has the protruding parts respectively at positions conforming to both ends of the area concerning the removed part E of the missing part F. More specifically, the two protruding parts of the convex part P1 are formed with a distance from each other in the direction along the gate wiring G, the distance between the protruding parts substantially corresponding to the area (dimension) of the removed part E in the same direction.

Thus, in the liquid crystal display panel 100 according to Embodiment 3, when the laser melting method is carried out by a worker, the worker can easily determine a portion where the SOG insulating film I2 is missing and the source wiring O is superposed onto the gate wiring G. Moreover, it is possible to presume an area where the SOG insulating film I2 is missing, i.e. an area concerning the removed part E, based on the shape of the convex part P1.

Portions similar to those in Embodiment 1 are denoted by the same reference codes and will not be described in detail.

Embodiment 4

Figure 7:
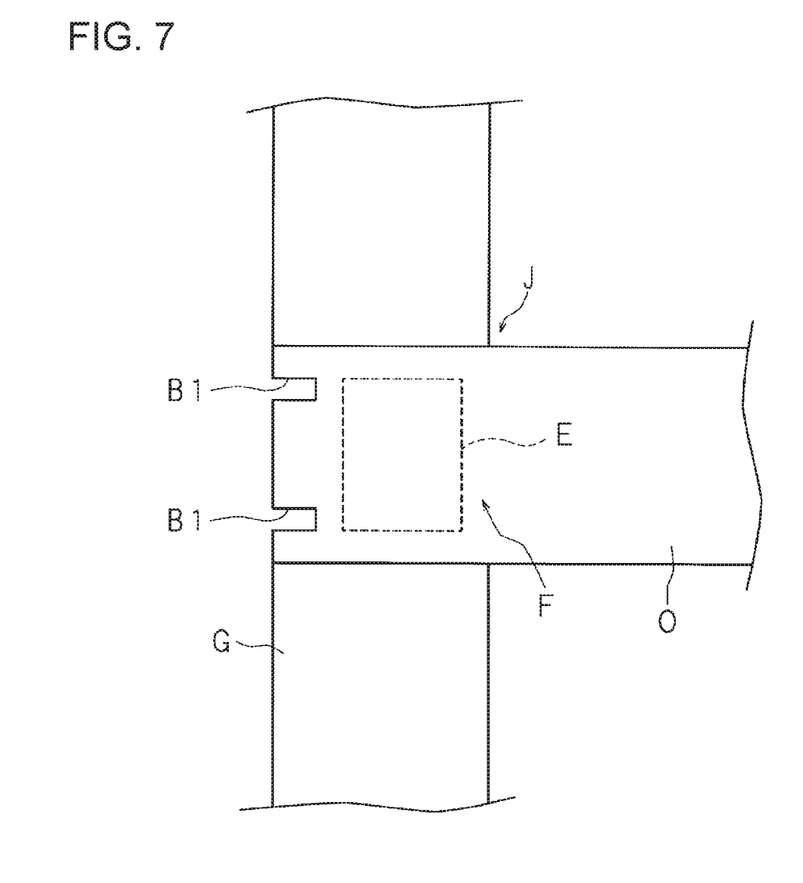
FIG. 7 is an explanatory view illustrating a shape of a concave part in the liquid crystal display panel according to Embodiment 4 of the present invention.

In Embodiment 4, instead of the concave part B, a concave part B1 consisting of two recesses is formed. This will be described below in detail.

FIG. 7 is an explanatory view illustrating the shape of the concave part B1 in the liquid crystal display panel 100 according to Embodiment 4 of the present invention. The portion enclosed by the dotted line represents an area concerning the removed part E.

The concave part B1 consists of two recesses formed at the position of the point J in the source wiring O where the source wiring O is superposed onto the gate wiring G, and is formed from the end of the source wiring O in a direction along the source wiring O. For example, each of the recesses of the concave part B1 has a rectangular shape, the direction along the source wiring O being the long-side direction.

Furthermore, the concave part B1 is formed at a position conforming to both ends of the missing area concerning the missing part F. That is, the concave part B1 has the recesses respectively at positions conforming to both ends of the area concerning the removed part E of the missing part F. More specifically, the two recesses of the concave part B1 are formed with a distance from each other in the direction along the gate wiring G, the distance between the recesses substantially corresponding to the area (dimension) of the removed part E in the same direction.

Thus, in the liquid crystal display panel 100 according to Embodiment 4, when the laser melting method is carried out by a worker, the worker can easily determine a portion where the SOG insulating film I2 is missing and the source wiring O is superposed onto the gate wiring G. Moreover, it is possible to presume an area where the SOG insulating film I2 is missing, i.e. an area concerning the removed part E, based on the shape of the concave part B1.

Portions similar to those in Embodiment 1 are denoted by the same reference codes and will not be described in detail.

Embodiment 5

Figure 8:
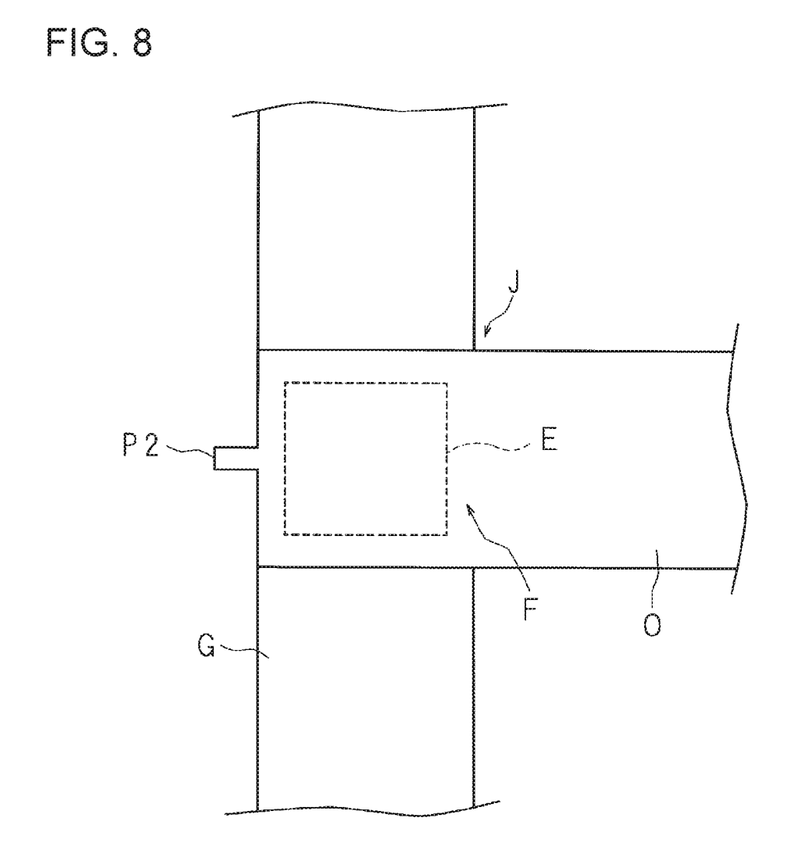
FIG. 8 is an explanatory view illustrating a shape of a convex part in the liquid crystal display panel according to Embodiment 5 of the present invention.

In Embodiment 5, instead of the convex part P1, a convex part P2 consisting of one protruding part is formed. This will be described below in detail.

FIG. 8 is an explanatory view illustrating a shape of the convex part P2 in the liquid crystal display panel 100 according to Embodiment 5 of the present invention. The portion enclosed by the dotted line represents an area concerning the removed part E.

The convex part P2 is one protruding part formed at the position of the point J in the source wiring O where the source wiring O is superposed onto the gate wiring G, and is formed from the end of the source wiring O so as to protrude in a direction along the layers. For example, the convex part P2 has a rectangular shape, the protruding direction being the long-side direction.

Furthermore, the convex part P2 is formed at a position conforming to the middle part of the missing area concerning the missing part F. That is, the convex part P2 is formed at a position conforming to the middle part of the area concerning the removed part E of the missing part F. More specifically, the convex part P2 is formed at a middle part in the area of the removed part E in the direction along the gate wiring G.

Thus, in the liquid crystal display panel 100 according to Embodiment 5, when the laser melting method is carried out by a worker, the worker can easily determine a portion where the SOG insulating film I2 is missing and the source wiring O is superposed onto the gate wiring G. Moreover, it is possible to presume an area where the SOG insulating film I2 is missing, i.e. an area concerning the removed part E, based on the shape of the convex part P2.

Portions similar to those in Embodiment 1 are denoted by the same reference codes and will not be described in detail.

Embodiment 6

Figure 9:
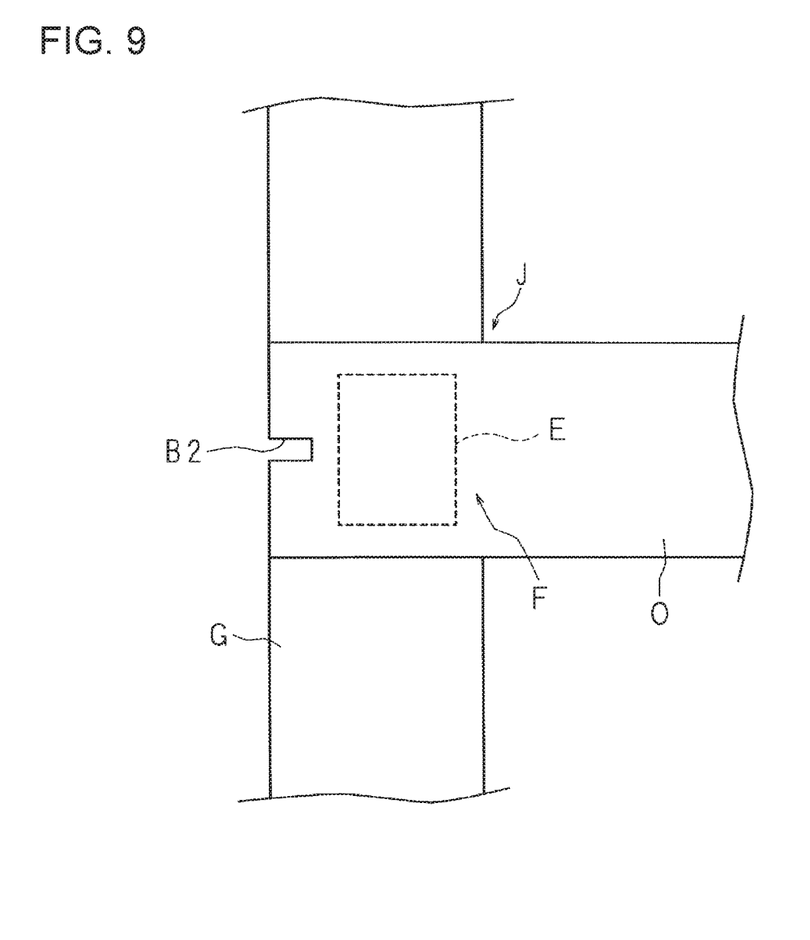
FIG. 9 is an explanatory view illustrating a shape of a concave part in the liquid crystal display panel according to Embodiment 6 of the present invention.

In Embodiment 6, instead of the concave part B1, a concave part B2 consisting of one recess is formed. This will be described below in detail.

FIG. 9 is an explanatory view illustrating the shape of the concave part B2 in the liquid crystal display panel 100 according to Embodiment 6 of the present invention. The portion enclosed by the dotted line represents an area concerning the removed part E.

The concave part B2 is a recess formed at the position of the point J in the source wiring O where the source wiring O is superposed onto the gate wiring G, and is formed from the end of the source wiring O in a direction along the source wiring O. For example, the concave part B2 has a rectangular shape, the direction along the source wiring O being the long-side direction.

Furthermore, the concave part B2 is formed at a position conforming to the middle part of the missing area concerning the missing part F. That is, the concave part B2 is formed at a position conforming to the middle part of the area concerning the removed part E of the missing part F. More specifically, the concave part B2 is formed at a position corresponding to a middle part in the area of the removed part E in the direction along the gate wiring G.

Thus, in the liquid crystal display panel 100 according to Embodiment 6, when the laser melting method is carried out by a worker, the worker can easily determine a portion where the SOG insulating film I2 is missing and the source wiring O is superposed onto the gate wiring G. Moreover, it is possible to presume an area where the SOG insulating film I2 is missing, i.e. an area concerning the removed part E, based on the shape of the concave part B2.

Portions similar to those in Embodiment 1 are denoted by the same reference codes and will not be described in detail.

Embodiment 7

While an example has been described above where the area concerning the removed part E is narrower than the width of each of the source wiring O and the gate wiring G in the vicinity of the point J, the present invention is not limited thereto. The present invention may also be applied to the case where the area concerning the removed part E is wider than the width of the source wiring O or the gate wiring G.

Figure 10:
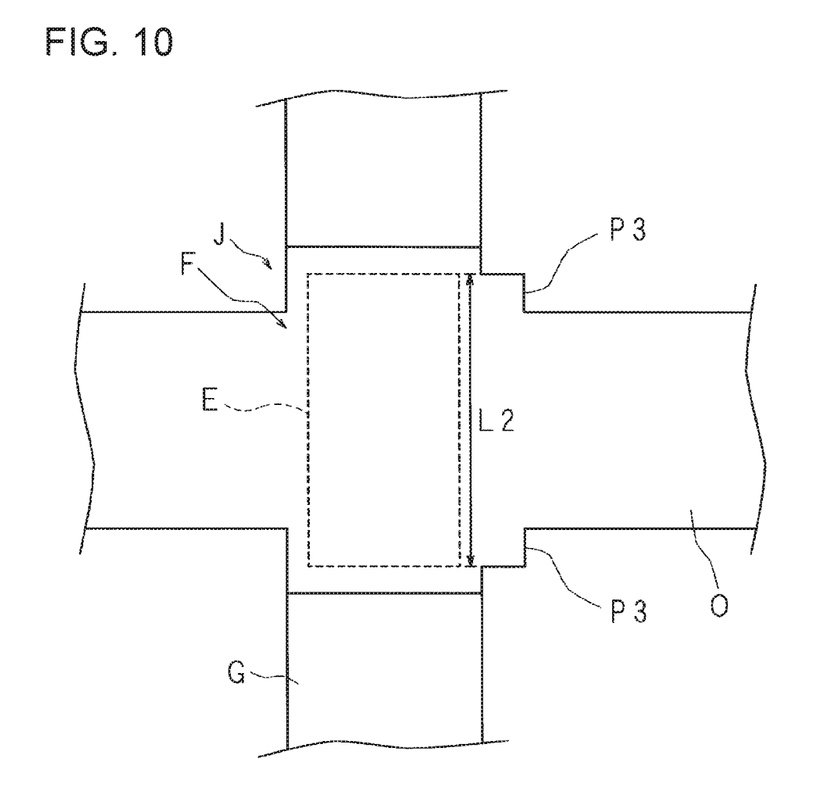
FIG. 10 is an explanatory view illustrating an application of the present invention in the case where an area concerning a removed part is larger than the width of a source wiring.

FIG. 10 is an explanatory view illustrating an application of the present invention in the case where the area concerning the removed part E is wider than the width of the source wiring O. In the drawing, the portion enclosed by the dotted line represents an area concerning the removed part E. As illustrated in FIG. 10, the source wiring O and the gate wiring G are superposed onto each other while crossing in the shape of "+," the area concerning the removed part E being wider than the width of the source wiring O.

In the source wiring O, a convex part P3 is formed at the position of the point J crossing the gate wiring G. The convex part P3 is formed in the source wiring O at either one of the both sides across the gate wiring G, while being formed at both sides in the width direction of the source wiring O.

That is, in portions which are the both ends in the width direction orthogonal to the direction along the source wiring O and adjacent to the missing part F (point J), protruding parts P3, P3 are so formed as to protrude in the direction along the layers. For example, each of the convex parts P3, P3 has a rectangular shape, the width direction being the long-side direction.

Furthermore, each of the convex parts P3, P3 has a shape conforming to either side of the area concerning the removed part E of the missing part F. More specifically, in the direction along the gate wiring G, a dimension L2 from the end of one convex part P3 to the end of the other convex part P3 corresponds to the area (dimension) of the removed part E in the same direction.

Thus, in the liquid crystal display panel 100 according to Embodiment 7, even in the case where the area concerning the removed part E is wider than the width of the source wiring O or the gate wiring G, when the laser melting method is carried out by a worker, the worker can easily determine a portion where the SOG insulating film I2 is missing and where the source wiring O is superposed onto the gate wiring G. Moreover, it is possible to presume an area where the SOG insulating film I2 is missing, i.e. an area concerning the removed part E, based on the shape of the convex part P3.

Portions similar to those in Embodiment 1 are denoted by the same reference codes and will not be described in detail.

While an example has been described where the convex part P, convex part P1, convex part P2, convex part P3, concave part B, concave part B1 or concave part B2 is formed at the position of the point J in the source wiring O superposed onto the gate wiring G, the present invention is not limited thereto. For example, a configuration in which the convex part P, convex part P1, convex part P2, convex part P3, concave part B, concave part B1 or concave part B2 is formed at the position of the point J in the gate wiring G superposed onto the source wiring O may also be employed.

Furthermore, not limited to the description above, the convex part P, convex part P1, convex part P2, convex part P3, concave part B, concave part B1 and concave part B2 may be formed to have the same shape as the missing part F (removed part E) in the layered direction.

Embodiment 8

Furthermore, while an example of the case where the insulating part I is formed of the GI insulating layer I1 and the SOG insulating film I2 in the description above, the present invention is not limited thereto. The present invention may also be applied to the case where the insulating part I is formed only of either one of the GI insulating layer I1 and the SOG insulating film I2. This will be described below in detail. It is to be noted that an example where the insulating part I is formed of the GI insulating layer I1 alone will be described for the sake of convenience.

Figure 11:
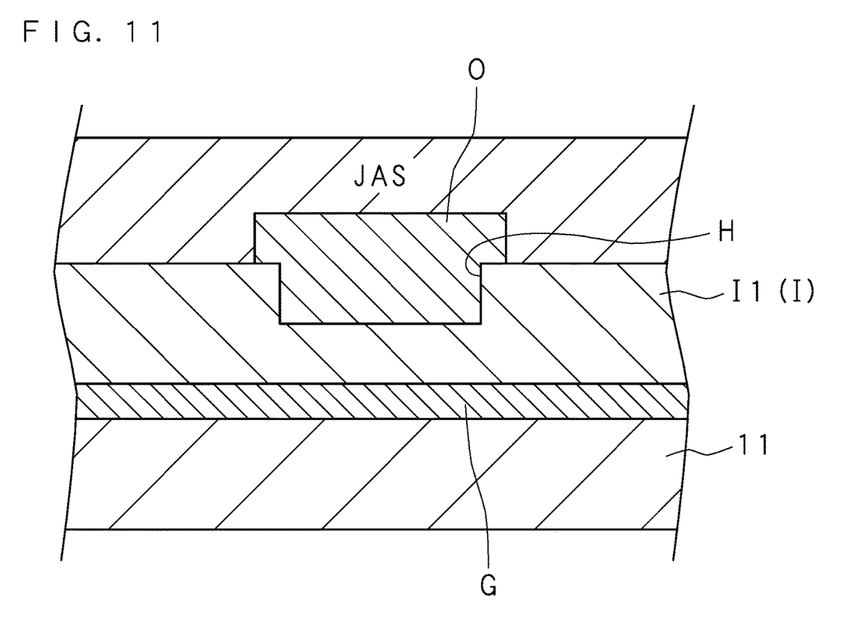
FIG. 11 is an explanatory view illustrating a case where an insulating part is formed of a GI insulating layer alone.

FIG. 11 is an explanatory view illustrating the case where the insulating part I is formed of the GI insulating layer I1 alone. The gate wiring G is layered on the surface of the TFT substrate 11 at the CF substrate 12 side, and the source wiring O is layered over the gate wiring G, with an insulating part I formed of a GI insulating layer I1 alone interposed in between. Moreover, at the CF substrate 12 side of the source wiring O, an organic interlayer insulating film (JAS) is formed.

Furthermore, the insulating part I has a missing part F. The missing part F is formed at the point J where the gate wiring G and the source wiring O are superposed onto each other in the layered direction of these wirings (see FIG. 3).

More specifically, a recess H is formed at the point J in the GI insulating layer I1. Accordingly, when a worker carries out the laser melting method, melting with laser may be facilitated in the recess H.

Even in the case where the point J has such a configuration, it is understood that the convex part P, convex part P1, convex part P2, convex part P3, concave part B, concave part B1 or concave part B2 may be formed at the position of the point J, as in Embodiments 1 to 7 described above.

Portions similar to those in Embodiment 1 are denoted by the same reference codes and are not be described in detail.

It is noted that, as used herein and in the appended claims, the singular forms "a", "an", and "the" include plural referents unless the context clearly dictates otherwise.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A circuit board comprising a substrate, a first wiring formed on the substrate, an insulating part formed to cover the first wiring, and a second wiring formed on the insulating part and superposed via the insulating part onto the first wiring in a predetermined superposition region, wherein
the insulating part has a multilayer structure including a plurality of insulating layers,
in the superposition region, the insulating part has a missing part where one insulating layer of the plurality of insulating layers only exists and the other is missing, and
a convex part or a concave part indicating a range of the missing part is formed at an edge of at least either of the first wiring and the second wiring.

2. The circuit board according to claim 1, wherein
the convex part or the concave part indicating the range of the missing part is a convex part or a concave part which extends from a position corresponding to one end of the missing part to a position corresponding to another end of the missing part.

3. The circuit board according to claim 1, wherein
the convex part or the concave part indicating the range of the missing part includes a convex part or a concave part formed at a position corresponding to one end of the missing part and a convex part or a concave part formed at a position corresponding to another end of the missing part.

4. A display apparatus, comprising:
the circuit board according to claim 1; and
a display unit at which an image is displayed based on a signal input through the wiring parts of the circuit board.

5. The circuit board according to claim 1, wherein
the convex part or the concave part is formed at the edge of the second wiring, the convex part or the concave part indicating the range of the missing part with respect to a direction in which the first wiring extends.

6. The circuit board according to claim 1, wherein
the convex part formed at the edge of one of the first wiring and the second wiring is not superposed on the other of the first wiring and the second wiring.

* * * * *